United States Patent [19]

Stultz

[11] 4,397,303

[45] Aug. 9, 1983

[54] HEAT EXCHANGER FOR CONCENTRATING SOLAR COLLECTORS AND METHOD FOR MAKING THE HEAT EXCHANGER

[75] Inventor: Richard A. Stultz, Franklin, Ohio

[73] Assignee: Armco Inc., Middletown, Ohio

[21] Appl. No.: 232,573

[22] Filed: Feb. 9, 1981

[51] Int. Cl.³ .............................................. F24J 3/02
[52] U.S. Cl. ...................................... 126/442; 126/438; 126/445; 165/78; 138/38; 29/157.3 R; 29/428; 136/244; 136/246
[58] Field of Search ............... 126/444, 445, 438, 439, 126/417, 432, 440, 442; 165/164, 165, 166, 76, 78; 138/37, 38; 29/157.3 R, 428; 136/244, 246

[56] References Cited

U.S. PATENT DOCUMENTS

| | | | |
|---|---|---|---|
| 2,783,682 | 3/1957 | Swenson | 126/444 X |
| 2,879,976 | 3/1959 | Rose, Sr. | 165/164 X |
| 3,299,948 | 1/1967 | Kudola, Jr. | 165/185 |
| 3,524,497 | 8/1970 | Chu et al. | 165/80 |
| 3,573,574 | 4/1971 | Davis | 317/234 |
| 3,844,341 | 10/1974 | Bimshas, Jr. et al. | 165/86 |
| 3,882,934 | 5/1975 | Knoos et al. | 165/164 |
| 3,971,435 | 7/1976 | Peck | 165/78 |
| 4,041,592 | 8/1977 | Kelm | 138/38 X |
| 4,045,246 | 8/1977 | Milavsky et al. | 136/89 |
| 4,069,812 | 1/1978 | O'Neill | 126/271 |
| 4,080,221 | 3/1978 | Manelas | 136/89 |
| 4,082,569 | 4/1978 | Evans, Jr. | 136/89 |
| 4,099,515 | 7/1978 | Schertz | 126/271 |
| 4,114,593 | 9/1978 | Guertin | 126/270 |
| 4,118,149 | 10/1978 | Graven et al. | 136/89 |
| 4,121,564 | 10/1978 | Schwartz | 126/438 X |
| 4,134,389 | 1/1979 | McClintock | 126/444 |
| 4,141,185 | 2/1979 | Keith | 126/445 X |
| 4,187,123 | 2/1980 | Diggs | 126/440 X |
| 4,262,740 | 4/1981 | Brune | 165/165 X |
| 4,298,059 | 11/1981 | Krauth et al. | 165/166 |
| 4,343,298 | 8/1982 | Ambille et al. | 126/438 |

Primary Examiner—Larry Jones
Attorney, Agent, or Firm—Frost & Jacobs

[57] ABSTRACT

A heat exchanger assembly for use with concentrating solar collectors of the type employing an elongated conduit for transporting a heat exchange fluid, the heat exchanger being positioned within an opening in the upper surface of the conduit and operating to transfer heat to the heat exchange fluid. The heat exchanger includes a plurality of stacked heat conducting heat exchanger plates having grooves oriented to form flow passage extending in the direction of fluid flow. The heat exchanger includes an alignment feature to insure proper alignment of the flow passages with the direction of heat exchange fluid flow. The grooved heat exchange plates may be fabricated by stamping from a sheet of heat conducting material to facilitate manufacturing of the heat exchanger. In another embodiment, the plates are positioned normal to the fluid flow direction with openings in the plates serving to form flow channels. The heat exchanger is usuable with collectors employing either photovoltaic cells or a solar radiation absorbing flat plate collector.

40 Claims, 14 Drawing Figures

HEAT EXCHANGER FOR CONCENTRATING SOLAR COLLECTORS AND METHOD FOR MAKING THE HEAT EXCHANGER

SUMMARY OF THE INVENTION

The present invention relates generally to concentrating solar collectors for converting solar radiation to electrical or heat energy, and more particularly to a single fluid heat exchanger for cooling such photovoltaic cells.

In one type of concentrating solar collector, a pair of spaced upwardly and outwardly extending side walls form an elongated trough-like collector housing of generally truncated conical-shaped cross section. Solar radiation conversion means such as a photovoltaic cell or solar radiation to heat conversion means may be positioned at the narrow end or focal point of the concentrator so that the incident solar radiation is concentrated within a relatively small area.

In the type of solar collector described using photovoltaic cells, it is well-known that a plurality of such photovoltaic cells may be placed at spaced locations along the longitudinal axis of the collector housing and connected electrically to increase the voltage or current output from the collector. In addition, the entire assembly may be pivotally mounted to track the sun and thereby maximize the amount of solar radiation incident on the photovoltaic cells.

A common problem associated with such collectors is the fact that the energy conversion of the photovoltaic cells is relatively inefficient, resulting in production of significant quantities of waste heat which must be quickly and efficiently dissipated to prevent damage to the cells. Consequently, the cells are often mounted upon a heat conducting plate or similar support forming part of a heat exchanger for conducting heat away from the cell. A typical heat exchange assembly includes an enlongated conduit extending parallel to the narrow end of the collector housing beneath the cells for carrying a flowing heat exchange fluid such as air, water or the like. A solid metallic plug-like member having a plurality of spaced parallel drilled-through holes oriented in the direction of fluid flow is inserted through an opening in the top of the conduit, and the photovoltaic cell mounted in heat exchange relationship on the top of the member. With such an arrangement, heat produced by the cell is transferred to the plug-like member, and consequently to the heat exchange fluid flowing through the openings in the member.

A similar type of heat exchanger assembly is often provided in concentrating solar collectors having means for heating a moving fluid via incident solar radiation. In such an arrangement, a typical heat exchanger assembly includes an elongated conduit extending parallel to the narrow end of the collector housing having an upper heat conducting surface exposed to the incident solar radiation, with the conduit carrying a flowing heat exchange fluid such as air, water or the like. The heat exchanging element may comprise a solid metallic member having a plurality of spaced parallel drilled through holes oriented in the direction of fluid flow. With such an arrangement, heat is transferred to the perforated heat exchanging member, and consequently to the heat exchange fluid flowing through the openings in the member.

In many instances, it has been found that such heat exchangers are difficult and expensive to build and install. In particular, a relatively large number of small parallel spaced openings must be provided through the plug-like or heat exchange member by drilling or other machining operations with a fair degree of accuracy. Such an operation is generally not adapted to automatic machining techniques. Furthermore, in the case of the heat exchanger used with photovoltaic cells, care must be taken when the plug-like member is installed to insure that the openings are parallel to the direction of flow of the heat exchange fluid to prevent unnecessary restrictions which can serve to reduce flow velocity and impair the heat exchange efficiency.

The present invention is directed to a heat exchanger design for use in the type of concentrating solar collectors described hereinabove which can be manufactured with a significant savings in cost over conventional heat exchangers, and can moreover be reliably and easily installed in the heat exchange fluid conduit.

In a first preferred embodiment, the heat exchanger of the present invention comprisies a plurality of stacked flat round or square disc-like heat exchanger plates, each of the plates bearing a plurality of spaced parallel grooves on one surface. The plates are oriented by keying means to prevent relative rotation between the plates, and to orient the grooves of adjacent plates in non-contiguous parallel relationship to form a plurality of spaced parallel flow passages extending in the direction of heat exchange fluid flow. Each of the heat exchanger plates may be easily fabricated by stamping or the like and held in place within the heat exchanger conduit by means of upper and lower keying members. The upper member is provided with a substantially planar upper surface for supporting the photovoltaic cell in heat conducting relationship so that heat removed from the cell may be easily transmitted through the upper member, and the stacked plates to the heat exchange fluid flowing through the flow passages. Alternately, the upper surface may form an absorber for converting solar radiation to heat. The lower heat exchanger member includes an upper plate-like surface configured to abut the lower surface of the lowermost one of said plates and a web-like member resting upon the inner lower surface of the fluid conduit and conforming to the cross sectional shape of the conduit so as to block fluid flow through the lower part of the conduit. The side edges of the web-like portion of the lower member may be provided with grooves cooperating with keying members secured to the sides of the conduit to secure the heat exchanger in place, and also to facilitate assembly of the heat exchanger so that the flow passages formed between the heat exchanger plates can be oriented only in the direction of heat exchange fluid flow.

In a second embodiment, the heat exchanger plates may be provided, by punching or the like, with a plurality of spaced openings or perforations. When the plates are positioned in stacked relationship with their axes perpendicular to the conduit axis, the coaxially oriented perforations form channels extending parallel to the direction of flow of the heat exchanger fluid. Keying means may also be provided with this embodiment to facilitate accurate placement within the flow conduit.

Further features of the invention will become apparent from the detailed description which follows:

DETAILED DESCRIPTION

A first embodiment of a concentrating solar collector having photovoltaic collecting cells using the improved heat exchanger of the present invention is illustrated generally at 1 in FIG. 1–FIG 4. Collector 1 comprises a pair of generally planar spaced upwardly and outwardly sloping side walls or panels 2 forming an elongated trough-like concentrating collector housing 3. The upper end of housing 3 may be provided with a suitable concentrating lens (not shown). The ends of housing 3 are closed by means of vertically extending plate-like trapezoidal-shaped bulkheads 4 supporting an outwardly extending horizontal tube-like shaft 5. Each of shafts 5 is supported by a journal bearing 6 to permit the entire collector 1 to pivot about a substantially horizontal axis extending parallel to the longitudinal axis of the collector. Through drive means, not shown, the angular position of collector 1 may be adjusted to track the sun and maximize the solar radiation impinging on the collecting means positioned within the collector housing as will be described in more detail hereinafter.

Figure 1:
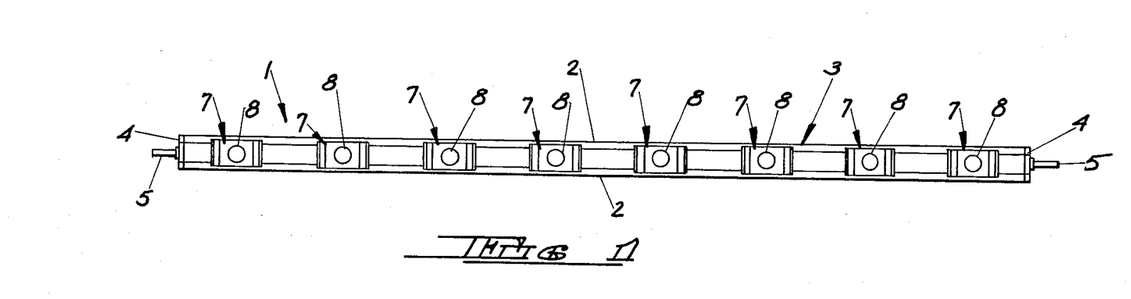
FIG. 1 is a top plan view of a first embodiment of the concentrating solar collector of the present invention illustrating several photovoltaic cell stations.
Figure 2:
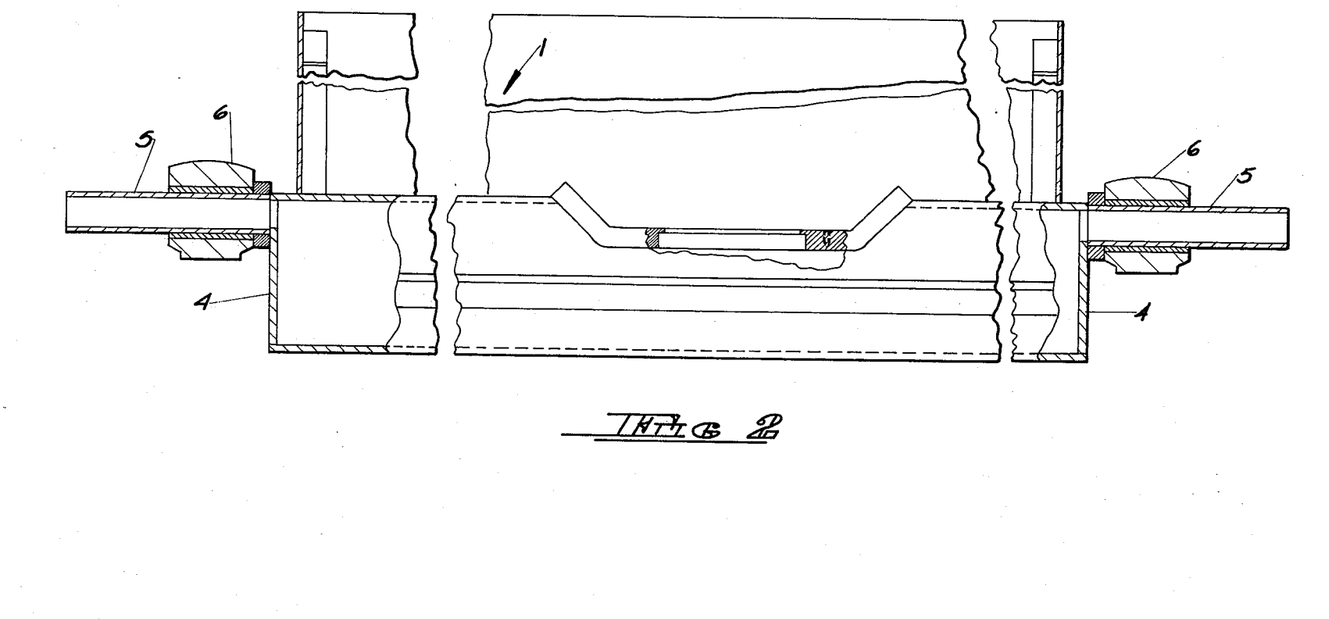
FIG. 2 is a fragmentary front cut-away plan view of the embodiment shown in FIG. 1 illustrating the end supports for the collector housing and a single photovoltaic cell station.
Figure 3:
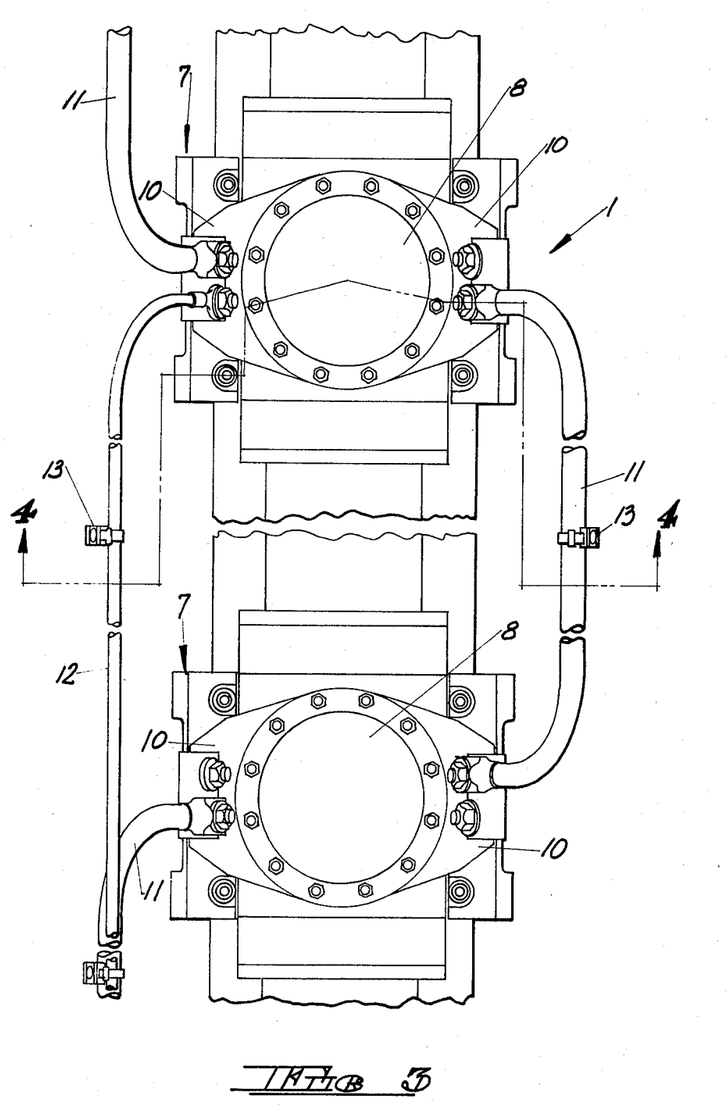
FIG. 3 is an enlarged fragmentary top plan view of the concentrating solar collector of FIG. 1 illustrating two photovoltaic cell stations.
Figure 4:
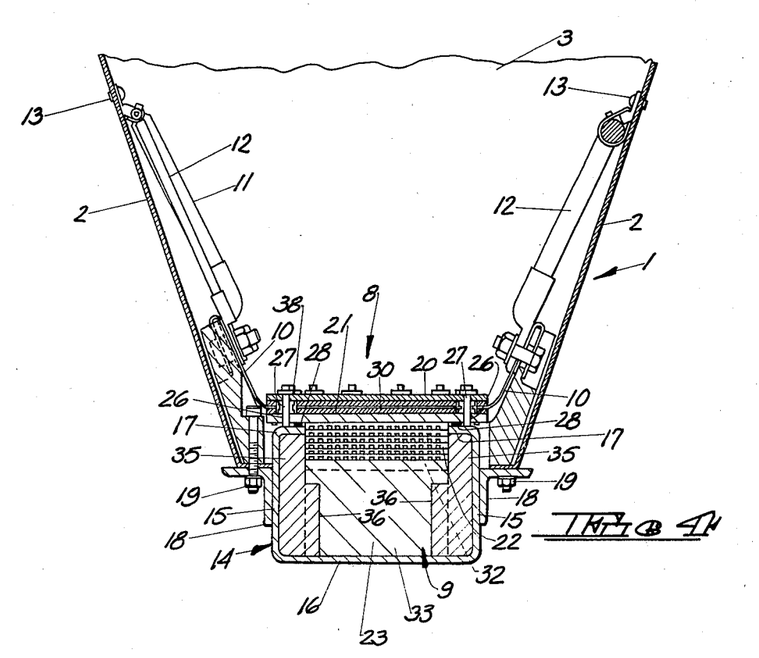
FIG. 4 is an enlarged cross sectional end view taken along section line 4—4 of FIG. 3.

As best shown in FIG. 1 and FIG. 3, a plurality of collector means stations, illustrated generally at 7, may be spaced longitudinally within collector housing 3. As illustrated in FIG. 4, each station 7 includes a photovoltaic cell assembly 8 of conventional design positioned at approximately the focal point in the narrow end of collector housing 3. Cell assembly 8 is supported and cooled by a heat exchanger assembly 9 which will be described in more detail hereinafter.

Electrical connection is made to the photovoltaic cell assembly 8 by means of a pair of upwardly and outwardly extending ears 10 and interconnecting electrical conductors 11 and 12, which may be secured for support to side walls 2 as at 13.

The narrow end of collector housing 3 is also provided with an elongated channel-shaped conduit 14 of generally rectangular cross section having spaced side walls 15, lower wall 16, and upper wall 17. An angle bracket 18 extends outwardly from the side walls 15 and forms a point of attachment for side walls or panels 2 of collector housing 3 as at 19.

The upper wall 17 of conduit 14 is provided with a plurality of spaced generally circular openings 20 dimensioned to accept heat exchanger assembly 9.

Figure 5:
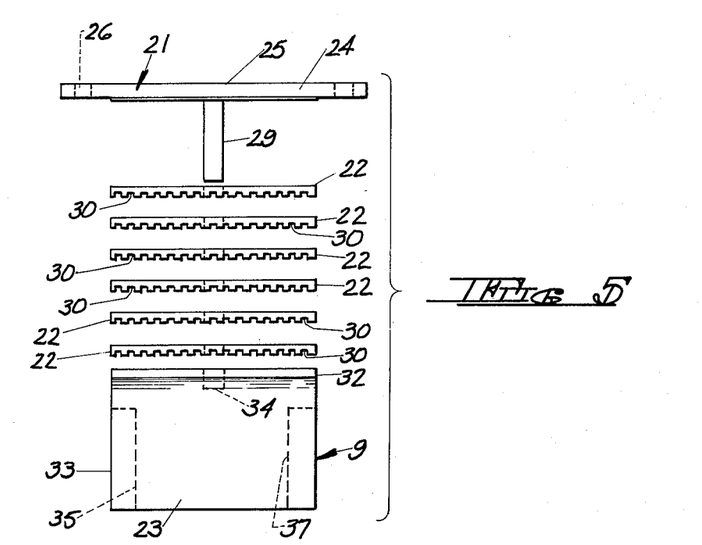
FIG. 5 is an exploded end view of the heat exchanger used in the embodiment of FIG. 1.
Figure 6:
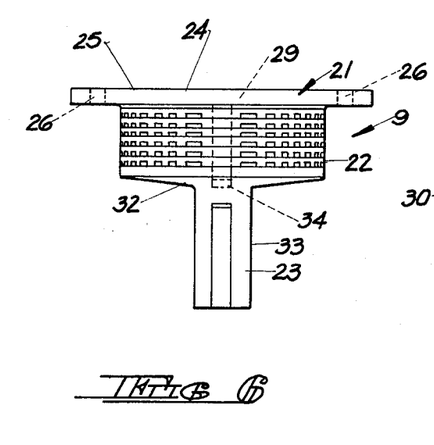
FIG. 6 is a side elevation view of the heat exchanger of FIG. 5.

Referring to FIG. 5 and FIG. 6, heat exchanger assembly 9 comprises an upper segment 21, a plurality of heat exchanger plates 22, and lower segment 23. Upper segment 21 comprises a generally circular plate 24 having a substantially planar smooth upper surface 25 for supporting the photovoltaic cell assembly 8 in heat conducting relationship as best shown in FIG. 4. Circular plate 24 is also provided with a number of circumferentially spaced apertures 26 for cooperating with threaded studs 27 secured to the upper wall 17 of conduit 14 circumferentially around opening 20 to securely hold heat exchanger assembly 9 and photovoltaic cell assembly 8 in position. Cushioning means 28 in the form of a resilient gasket or the like may also be provided between the lower outer edge of circular plate 24 and the upper surface of upper wall 17 adjacent opening 20. The lower surface of circular plate 24 is provided with a downwardly depending keying member 29 of generally rectangular cross section.

Figure 7:
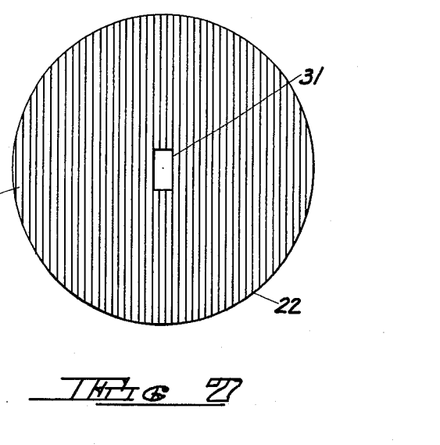
FIG. 7 is a bottom elevation view of a single round heat exchanger plate used in the heat exchanger of FIG. 5.
Figure 8:
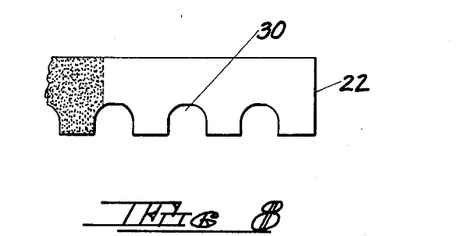
FIG. 8 is a fragmentary cross sectional view of the heat exchanger plate of FIG. 7.
Figure 9:
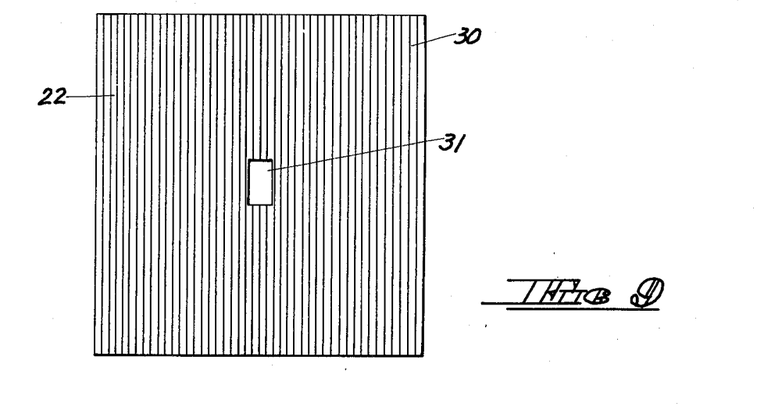
FIG. 9 is a bottom elevation view of a single square heat exchanger plate usuable in the heat exchanger of FIG. 5.

As best shown in FIG. 7 and FIG. 8, heat exchanger plates 22 comprise a generally flat round disc bearing a plurality of spaced parallel grooves 30 on one surface. Alternatively, plates 22 may be square in shape as illustrated in FIG. 9, or other shapes to conform to the internal configuration of conduit 14. It will be understood that the size and cross sectional configuration of grooves 30 may be varied as desired for particular applications. In addition, some or all of heat exchanger plates 22 may be provided with similarly configured grooves 30 on both sides of the plates. A generally rectangular central opening 31 is provided in plate 22 and is dimensioned to mate with keying member 29 in order to orient grooves 30 of adjacent plates in non-contiguous parallel relationship to form a plurality of spaced parallel flow passages, as well as to prevent relative rotation between the plates and upper segment 21. As best shown in FIG. 4, grooves 30 forming the flow passages are oriented in a direction generally parallel to the longitudinal axis of conduit 14.

Grooves 30 may be provided on the appropriate surface or surfaces of heat exchanger plate 22 by machining or stamping, this latter method being preferred in order to facilitate fabrication of the plate inasmuch as a plurality of plates may be stamped from a single sheet of material and provided with the appropriate grooves at the same time. For purposes of an exemplary showing in the present embodiment, heat exchanger 9 has been provided with six heat exchanger plates 22. However, it will be understood that any number of plates may be used in a particular application.

As best shown in FIG. 5 and FIG. 6, lower segment 23 comprises a generally circular plate member 32 terminating in a downwardly extending web-like member 33. The upper surface of plate portion 32 is provided with a smooth planar surface for abutting and supporting the lower surface of the lowermost one of heat exchanger plate 22. In addition, the upper surface of plate portion 32 is provided with a centrally located bore 34 of generally rectangular shape for accepting the lower end of keying member 29 in order to prevent relative rotational movement between lower segment 23 and upper segment 21. When assembled as illustrated in FIG. 6, upper segment 21, heat exchanger plates 22 and lower segment 23 form an integral unit forming heat exchanger assembly 9. If desired, the various parts may be joined by resistance welding or the like, or may be unattached to facilitate repair or disassembly.

As illustrated in FIG. 4, each side wall 15 of conduit 14 is provided with a vertically positioned plug member 35 extending inwardly for effectively blocking the space between the side edges of web-like member 33 and the inner surfaces of side wall 15. Each plug member 35 is further provided with an inwardly extending vertically oriented tab member 36 which cooperates with matching grooves 37 in the outer edges of web-like member 33. As best shown in FIG. 4 and FIG. 5, grooves 37 cooperate with tab members 36 to orient the flow passages formed by grooves 30 in heat exchanger plates 22 in a direction parallel to the longitudinal axis of conduit 14 and also prevent relative movement of the entire heat exchanger assembly 9 with respect to conduit 14. It will be understood that the components associated with heat exchanger assembly 9 may be fabricated from any suitable heat conducting material such as aluminum or the like. Furthermore, while for purposes of an exemplary showing, conduit 14 has been described and illustrated as having a generally rectangular cross section, it will be understood that various other shapes such as cylindrical, semi-cylindrical and the like may be utilized with a corresponding modification made to the shape of heat exchanger assembly 9.

In operation, each heat exchanger assembly 9 may be inserted as an entire unit or individual components through opening 20 in conduit 14 such that apertures 26 in circular plate 24 are positioned over threaded studs 27. As noted above, heat exchanger assembly 9 may be inserted into conduit 14 in only one way in order to permit grooves 37 in web-like member 33 to mate with inwardly extending tab members 36. Consequently, all grooves 30 are oriented in a direction parallel to the longitudinal axis of conduit 14, and cannot become misaligned.

Following installation of heat exchanger assembly 9, the photovoltaic cell assembly 8 may be positioned on the upper surface 25 of circular plate 24, and held in place by means of nuts, one of which is shown at 38, cooperating with threaded studs 27. The electrical connections to connecting ears 10 may then be made as illustrated.

To remove the heat produced during operation of the photovoltaic cells, a suitable heat exchange fluid such as air, water or the like may be directed through conduit 14 by means not shown. Inasmuch as the lower portion of conduit 14 is blocked by lower segment 23 and plug members 35, the fluid is forced to flow through the flow passages formed by grooves 30 in the heat exchanger plates 22. Heat produced by the photovoltaic cell assembly 8 may then be conducted through circular plate 24 and heat exchanger plates 22 to the heat conducting fluid.

Figure 10:
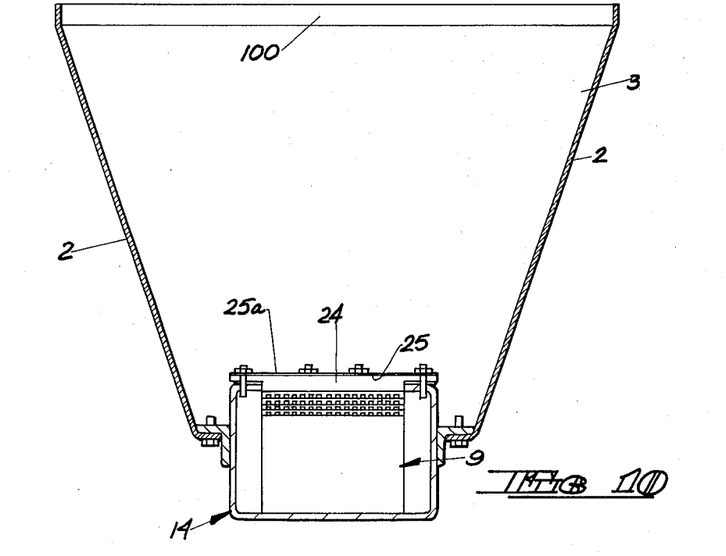
FIG. 10 is a cross sectional end view of a second embodiment of the present invention.

A second embodiment of a concentrating solar collector using the heat exchanger of the present invention in connection with means for converting incident solar radiation to heat is illustrated in FIG. 10, where elements similar to those previously described have been similarly designated. In this arrangement, heat exchanger assembly 9 is constructed in a manner identical with that previously described, except that the upper surface 25 of circular plate 24 is provided with a solar radiation absorbing coating 25a which serves to convert incident solar radiation falling on surface 25 to usable heat. The means previously desribed to mount the photovoltaic cells, and the cells themselves, have been eliminated in this embodiment.

To further enhance the effectiveness of the collector, a concentrating lens 100 may be provided so as to be supported by the upper longitudinal edges of side walls or panels 2 which form the elongated trough-like concentrating collector housing 3. It will be understood that lens 100 is so constructed as to focus solar radiation on the coated surface 25a of the heat exchanger assembly 9.

Figure 11:
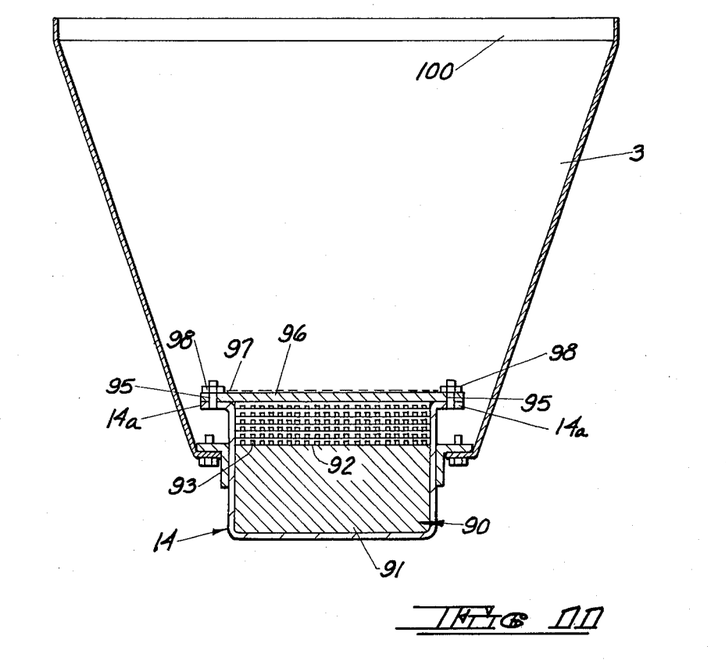
FIG. 11 is a cross sectional end view of a third embodiment of the present invention.
Figure 12:
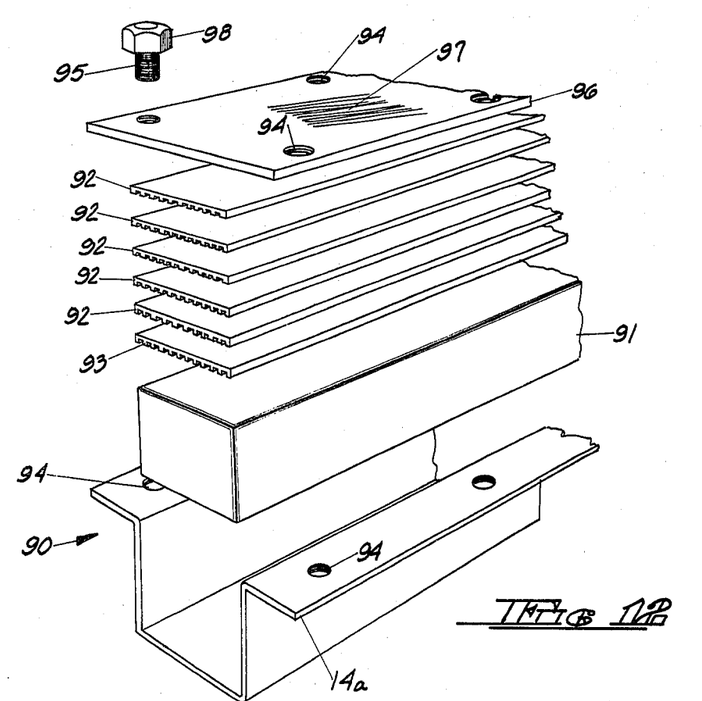
FIG. 12 is an exploded perspective view of the heat exchanger plate arrangement of the embodiment of FIG. 11.

Another embodiment of the heat exchanger assembly, designated 90, is illustrated in FIG. 11 and FIG. 12. In this arrangement, the upper wall 17 of channel-shaped conduit 14 has been eliminated along the length of the conduit. In addition, the supporting flanges, designated 14a in FIG. 11, have been turned outwardly, rather than extending inwardly as in the embodiments previously described. In all other respects, the details of the collector housing 3 and lens 100 may also be as previously described.

In this embodiment, the heat exchanger assembly, shown generally at 90, comprises an elongated block-like solid member 91 positioned in the lower trough-like portion of conduit 14, which extends the length of the conduit and serves to block fluid flow through that portion of the conduit. A plurality of thin elongated heat exchanger plates 92 of generally rectangular shape are arranged in stacked relationship on top of member 91. As illustrated in FIG. 12, each of plates 92 is provided with a plurality of parallel extending grooves or notches, one of which is shown at 93, which will be oriented in the direction of fluid flow within conduit 14 when the plates are positioned as illustrated in FIG. 11. For purposes of an exemplary showing, grooves 93 are shown extending along the lower surfaces of plates 92; however, it will be understood that the grooves may also be provided on the upper surface of the plates, or on both surfaces as previously described.

To complete heat exchanger assembly 90, a solid rectangular-shaped heat conducting plate 96, which may include a solar radiation absorbing coating 97 on its upper surface, is positioned in heat conducting relationship with the uppermost one of plates 92 so as to extend between and be supported by flanges 14a. Plate 96 holds plates 92 in position by means of apertures 94 which cooperate with threaded studs 95, and may be secured to channel 14 by means of lock nuts or the like 98. It will be observed that this arrangement permits a heat exchanging assembly which extends substantially the entire length of the solar collector. Furthermore, plates 92 and 96 may be provided in separate sections placed end-to-end, or may be formed from plates which extend the entire length of the collector. In either event, solar radiation impinging on coated surface 97 will heat plate 96, with this heat being transferred to plates 92 and consequently to the fluid flowing through the openings or channels formed by grooves or notches 93. If desired, member 91 may be reduced in thickness or eliminated altogether, so that the entire interior of channel 14 is filled with longitudinally extending stacked plates 92.

Figure 13:
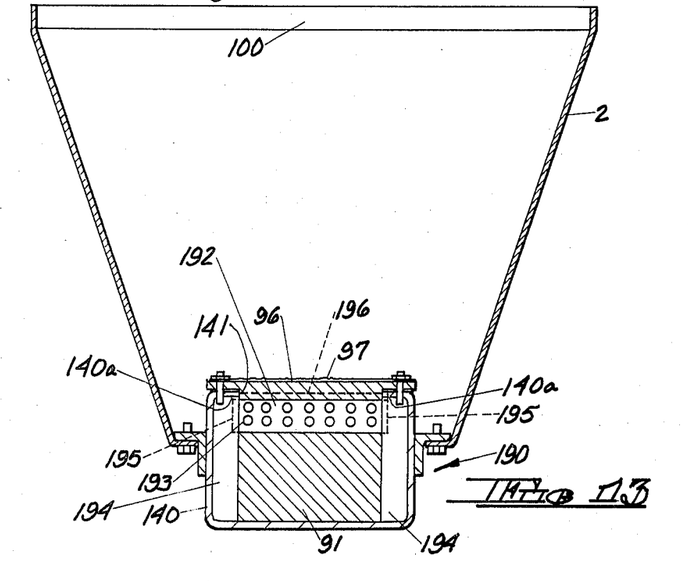
FIG. 13 is a cross sectional end view of a fourth embodiment of the present invention.
Figure 14:
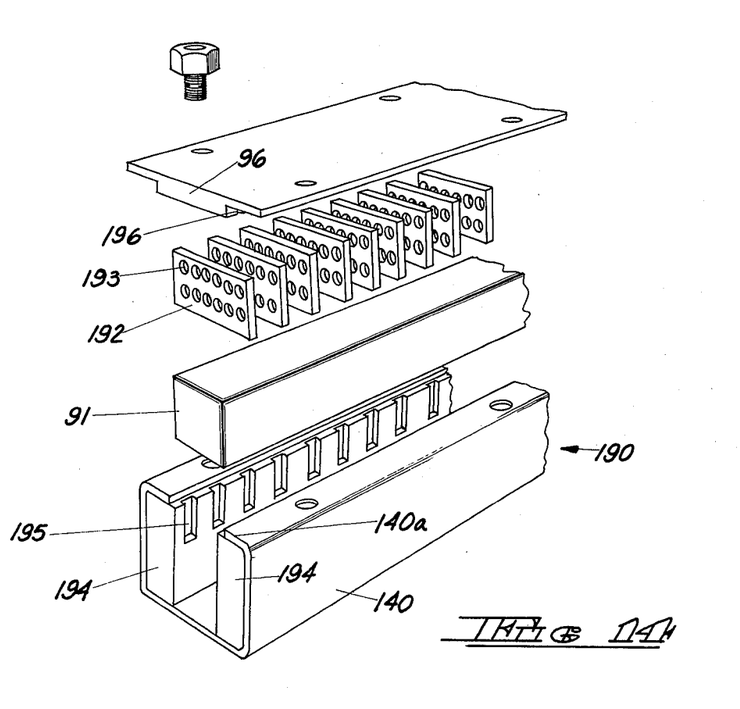
FIG. 14 is an exploded perspective view of the heat exchanger plate arrangement of the embodiment of FIG. 13.

Another embodiment of the present invention is illustrated in FIGS. 13 and 14, where elements similar to those previously described have been similarly designated. In this embodiment, a channel-like conduit 140 is utilized having inwardly extending flange portions 140a and an upper opening 141 extending substantially the length of the conduit and collector. In all other respects, the solar collector construction is similar to that described hereinbefore in connection with the embodiment of FIG. 11 and FIG. 12, except that the heat exchanger assembly, designated in this embodiment at 190, is formed from a plurality of vertically extending plates 192 having a plurality of spaced openings or bores 193 extending therethrough.

In this arrangement, a lower block-like elongated member 91 is positioned in the lower part of conduit 140 so as to block fluid flow in the lower portion of the conduit. In addition, a vertically extending block-like member 194 is provided along the sides of conduit 140 adjacent the side walls to block fluid flow in this area.

As illustrated in FIG. 14, plates 192 are positioned on edge on the upper surface of member 91 so as to extend between side members 194 substantially perpendicular to the direction of fluid flow. Plates 192 are also positioned one behind the other so that the openings 193 are substantially coaxial, forming channels through which the fluid may flow and absorb heat from the heated plates 192. If desired, openings 193 may be offset in adjacent plates so as to form a circuitous flow path. In addition, the plates 192 may be positioned abutting each other, or may be spaced along the length of conduit 140. To hold plates 192 in position, a plurality of spaced vertically extending grooves 195 may be provided along the interior edge of side members 194. Alternatively, or in addition to grooves 195, a plurality of horizontally extending spaced parallel grooves 196 may be provided in the lower surface of upper plate 96 so as to hold the upper edges of plate 192.

In operation, solar radiation impinging on solar absorbing surface 97 heats plate 96, with this heat being transferred to plates 192 which are in heat conducting contact with the lower surface of upper plate 96. This heat is then transferred to the fluid flowing through openings 193 and plates 192 with with the heated fluid being used as is well known in the art.

It will be understood that various changes in the details, materials, steps and arrangements of parts, which have been herein described and illustrated in order to explain the nature of the invention, may be made by those skilled in the art, within the principle and scope of the invention as expressed in the appended claims. For example, as noted above, as many heat exchanger plates 22 may be utilized as is necessary in a particular application to provide adequate cooling for the photovoltaic cell assembly 8 or to heat the heat exchange fluid. The efficiency of the heat exchanger may be further altered by the size and spacing of the grooves or openings in the plates. Finally, in some instances it may be found desirable for some of the heat exchanger fluid flow to bypass the flow passages formed by the grooves or openings. In this instance, suitable openings may be formed in web-like member 33 of lower segment 23, for example, or plug members 35 may be reduced in size to provide openings between these members and the side wall 15 of conduit 14 or heat exchanger assembly 9.

In addition, as used herein a "stack" of the heat exchanger plates or "stacking" the heat exchanger plates refers to arranging the plates in either touching adjacent relationship as shown, for example, in the embodiment of FIG. 4–FIG. 6 or FIG. 10–FIG. 12, or in non-touching adjacent relationship as illustrated, for example, in the embodiments of FIG. 13–FIG. 14. Furthermore, as used herein, means for converting solar radiation to heat energy includes photovoltaic cells such as included in photovoltaic cell assembly 8 as well as flat plate collectors of the type exemplified by plate 24 provided with solar radiation absorbing coating 25a.

The embodiments of the invention in which an exclusive property or privilege is claimed are as follows:

1. An assembly for collecting solar energy comprising:
   conduit means for transporting a heat exchange fluid, said conduit means including an opening in the upper surface thereof;
   heat exchanger means positioned within said opening and extending into said conduit means comprising a plurality of stacked heat conducting heat exchanger plates having means oriented to form flow passages extending in the direction of fluid flow, said orienting means including means for aligning said plates with each other to assure that said flow passages extend in the direction of fluid flow; and
   means for converting solar radiation to heat energy positioned on said heat exchanger means, said heat exchanger means operating to transfer heat from said converting means to the heat exchange fluid.

2. The solar energy collecting assembly according to claim 1 wherein said flow passage forming means comprises a plurality of spaced grooves formed in the surface of said plates.

3. The solar energy collecting assembly according to claim 2 including a pair of upwardly and outwardly sloping side walls forming a trough-like concentrating collector housing overlying and extending parallel to said conduit means, said converting means being positioned between said walls.

4. The solar energy collecting assembly according to claim 3 including means for pivoting said assembly for tracking the sun to optimize the amount of solar radiation impinging on said converting means.

5. The solar energy collecting assembly according to claim 2 wherein each of said heat exchanger plates includes a plurality of spaced parallel grooves on one surface only.

6. The solar energy collecting assembly according to claim 5 wherein said plates are stacked such that said grooves of adjacent plates are non-adjacent.

7. The solar energy collecting assembly according to claim 2 wherein said plates are positioned longitudinally in stacked overlying relationship within said conduit.

8. The solar energy collecting assembly according to claim 7 wherein said flow passage forming means comprises a plurality of spaced grooves formed on the surface of said plates.

9. The solar energy collecting assembly according to claim 8 wherein said converting means comprises photovoltaic cell means for converting solar radiation to electrical energy.

10. The solar energy collecting assembly according to claim 8 wherein said converting means comprises a heat conducting plate-like member positioned in heat transfer relationship with said stacked plates, the upper surface of said member including a solar radiation absorbing coating.

11. The solar energy collecting assembly according to claim 1 including a plurality of said heat exchanger means and converting means mounted in separate ones of said openings spaced along said conduit means.

12. The solar energy collecting assembly according to claim 1 including means within said conduit means for forcing substantially all of the heat exchange fluid to pass through said flow passages.

13. The solar energy collecting assembly according to claim 1 wherein said alignment means comprises means for aligning said heat exchanger means within said conduit means.

14. The solar energy collecting assembly according to claim 1 wherein said converting means comprises photovoltaic cell means for converting solar radiation to electrical energy.

15. The solar energy collecting assembly according to claim 1 wherein said converting means comprises a heat conducting plate-like member positioned in heat transfer relationship with said stacked plates, the upper surface of said member including a solar radiation absorbing coating.

16. The solar energy collecting assembly according to claim 2 wherein said heat exchanger means comprises:
a heat conducting plate-like upper segment having an upper surface forming said converting means and wherein said orienting means includes keying means associated with the lower surface of said upper segment and means associated with said heat exchanger plates for mating with said keying means to prevent relative rotation between said plates and said upper segment and to orient said grooves to extend in the direction of fluid flow; and
a lower segment having an upper surface configured to support the lowermost one of said heat exchanger plates, means for preventing relative rotation between said upper segment and said lower segment, and means for aligning said lower segment within said conduit.

17. The solar energy collecting assembly according to claim 16 wherein said keying means comprises a shaped rod-like member depending from said upper segment, and said mating means comprises an aperture in said heat exchanger plate of a shape configured to cooperate with said rod-like member.

18. The solar energy collecting assembly according to claim 17 wherein said means for preventing relative rotation between said upper and lower segments comprises a bore in the upper surface of said lower segment of a shape configured to cooperate with said rod-like member.

19. The solar energy collecting assembly according to claim 18 wherein said means for aligning said lower segment within said conduit comprises a pair of tab members extending inwardly from the side walls of said conduit means and grooves in the outer edges of said lower segment configured to mate with said tab members.

20. The solar energy collecting assembly according to claim 19 wherein said tab members and said lower segment are configured to block fluid flow through the lower portion of said conduit means for forcing substantially all of the heat exchange fluid to pass through said flow passages.

21. The solar energy collecting assembly according to claim 16 wherein said converting means comprises photovoltaic cell means for converting solar radiation to electrical energy.

22. The solar energy collecting assembly according to claim 16 wherein the upper surface of said upper segment is provided with a solar radiation absorbing coating.

23. The solar energy collecting assembly according to claim 16 wherein said plates are of circular shape.

24. The solar radiation collecting assembly according to claim 14 wherein said plates are of square shape.

25. The solar energy collecting assembly according to claim 1 wherein said plates are positioned substantially normal to the direction of fluid flow.

26. The solar energy collecting assembly according to claim 25 wherein said flow passage forming means comprises a plurality of spaced openings extending through said plates.

27. The solar energy collecting assembly according to claim 26 including means associated with the inner surfaces of said conduit for maintaining said plates in spaced relationship.

28. The solar energy collecting assembly according to claim 27 wherein said converting means comprises photovoltaic cell means for converting solar radiation to electrical energy.

29. The solar energy collecting assembly according to claim 27 wherein said converting means comprises a heat conducting plate-like member positioned in heat transfer relationship with said stacked plates, the upper surface of said member including a solar radiation absorbing coating.

30. The solar energy collecting assembly acording to claim 1 including a liquid heat exchange fluid within said conduit means.

31. In an assembly for collecting solar energy having conduit means containing an opening in the upper surface for transporting a heat exchange fluid, heat exchanger means positioned within said opening and extending into said conduit means, and means for converting solar radiation to heat energy positioned on the heat exchanger means, the heat exchanger means operating to transfer heat from the converting means to the heat exchange fluid, a method for making the heat exchanger comprising:
providing a plurality of heat conducting plates having means for forming a plurality of flow passages;
stacking said plates in adjacent relationship and orienting said plates with respect to each other and said conduit such that said flow passage forming means form flow passageways extending generally in the direction of fluid flow within the conduit to permit flow of the heat exchange fluid therethrough when said stacked plates are mounted within the conduit means opening; and
providing means for mounting said heat exchanger within said opening.

32. The method according to claim 31 wherein said plates are formed by stamping from a sheet of heat conducting material.

33. The method according to claim 31 including providing said plates with said flow passage forming means comprising a plurality of spaced grooves.

34. The method according to claim 33 wherein said grooves are formed by stamping.

35. The method according to claim 33 wherein said grooves are formed in spaced parallel relationship on one surface only of said plates.

36. The method according to claim 33 including the step of orienting said plates such that said grooves of adjacent plates are non-adjacent.

37. The method according to claim 33 including the step of arranging said plates such that they extend longitudinally within said conduit.

38. The method according to claim 33 including the step of providing a plurality of spaced openings and mounting means, and positioning stacked plates within each of said openings.

39. The method according to claim 31 including providing said plates with said flow passage means comprising a plurality of spaced apertures.

40. The method according to claim 39 wherein said plates are stacked in non-contiguous relationship.

* * * * *